(12) United States Patent
Ping et al.

(10) Patent No.: US 6,194,264 B1
(45) Date of Patent: *Feb. 27, 2001

(54) SEMICONDUCTOR PROCESSING METHOD OF MAKING A HEMISPHERICAL GRAIN (HSG) POLYSILICON LAYER

(75) Inventors: Er-Xang Ping; Randhir P. S. Thakur, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/926,596

(22) Filed: Aug. 20, 1997

Related U.S. Application Data

(63) Continuation of application No. 08/591,227, filed on Jan. 18, 1996, now Pat. No. 5,691,228.

(51) Int. Cl.$^7$ .............................................. H01L 21/8242
(52) U.S. Cl. .................................................. 438/255
(58) Field of Search ........................... 438/253–256, 438/390–399

(56) References Cited

U.S. PATENT DOCUMENTS

| | | | |
|---|---|---|---|
| 5,227,322 | 7/1993 | Ko et al. | 437/52 |
| 5,256,587 | 10/1993 | Jun et al. | 437/52 |
| 5,385,863 | * 1/1995 | Tatsumi et al. . | |
| 5,407,534 | 4/1995 | Thakur | 437/247 |
| 5,623,243 | * 4/1997 | Watanabe et al. | 257/309 |
| 5,691,228 | * 11/1997 | Ping et al. . | |

OTHER PUBLICATIONS

Wolf et al., pp. 191–192, vol. 1, silicoon processing for the VLSI era, Lattice Press, 1986.*

* cited by examiner

*Primary Examiner*—Jey Tsai
(74) *Attorney, Agent, or Firm*—Wells, St. John, Roberts, Gregory & Matkin

(57) ABSTRACT

A semiconductor processing method of providing a hemispherical grain polysilicon layer atop a substrate includes, a) providing a substantially amorphous layer of silicon over a substrate at a selected temperature; b) raising the temperature of the substantially amorphous silicon layer to a higher dielectric layer deposition temperature, the temperature raising being effective to transform the amorphous silicon layer into hemispherical grain polysilicon; and c) depositing a dielectric layer over the silicon layer at the higher dielectric deposition temperature. Transformation to hemispherical grain might occur during the temperature rise to the higher dielectric layer deposition temperature, after the higher dielectric layer deposition temperature has been achieved but before dielectric layer deposition, or after the higher dielectric layer deposition temperature has been achieved and during dielectric layer deposition. The temperature raising step can include initially raising the silicon layer temperature to an annealing temperature below the higher dielectric layer deposition temperature, and maintaining the silicon layer at the annealing temperature for a time period effective to increase its degree of surface roughness. Subsequently the silicon layer temperature is raised to the higher dielectric layer deposition temperature, with such further increasing the degree of surface roughness of the resultant silicon layer.

10 Claims, 4 Drawing Sheets

SEMICONDUCTOR PROCESSING METHOD OF MAKING A HEMISPHERICAL GRAIN (HSG) POLYSILICON LAYER

RELATED PATENT DATA

This patent resulted from a continuation application of U.S. patent application Ser. No. 08/591,227, filed on Jan. 18, 1996 U.S. Pat. No. 5,691,228, and listing the inventors as Er-Xuan Ping and Randhir P. S. Thakur.

TECHNICAL FIELD

This invention relates generally to semiconductor processing methods of providing a roughened polysilicon film and to capacitor constructions incorporating roughened polysilicon films.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes a roughened outer surface area is hemispherical grain (HSG) polysilicon typically provided to a thickness of from 300 Angstroms to 400 Angstroms. Such can be deposited or grown by a number of techniques. One technique includes direct LPCVD formation at 590° C. Another includes formation by first depositing an amorphous silicon film at 550° C using He diluted $SiH_4$ (20%) gas at 1.0 Torr, followed by a dedicated subsequent high temperature transformation anneal.

One typical prior art process for providing a hemispherical grain layer of polysilicon for use as a capacitor electrode is described with reference to FIGS. 1–5. FIG. 1 illustrates a semiconductor wafer fragment 10 comprising a bulk monocrystalline silicon substrate 12 having a diffusion region 14 provided therein. An insulating dielectric layer 16 is provided over substrate 12, and having a contact opening 18 therethrough to diffusion region 14. A thin, substantially amorphous, silicon layer 20 is grown or otherwise provided outwardly of insulating layer 16 and within contact opening 18 in electrical connection with diffusion region 14.

Referring to FIG. 2, the temperature of the wafer is raised to a suitable annealing temperature to render layer 20 into a hemispherical grain layer 20a. The typical annealing temperature for producing layer 20a is 625° C. Particle or other seeding can be provided outwardly of layer 20 prior to the annealing temperature to facilitate hemispherical grain growth.

Wafer fragment 10 is then typically transferred through ambient air to other suitable equipment for deposition of a desired capacitor dielectric layer outwardly of layer 20a. During the transfer of the wafer fragment to the dielectric layer deposition equipment, the temperature of the wafer is effectively lowered toward room ambient temperature. Subsequently, the wafer temperature is raised to the desired dielectric deposition temperature within the deposition equipment, which is higher than the hemispherical grain annealing temperature. This results in additional and undesired annealing of layer 20a. This additional annealing effectively smoothens the previously provided HSG layer, resulting in grain size expansion and overlap in producing the undesired smoother layer 20b of FIG. 3.

FIG. 4 illustrates subsequent $Si_3N_4$ dielectric layer deposition. Subsequently, an outer capacitive plate or electrode would be provided. The resultant outer surface of layer 20b is thus undesirably smoother than layer 20a, thus reducing the desired increase in capacitance that would have been achieved by the surface roughening of the FIG. 2 step.

FIG. 5 illustrates the example prior art temperature vs. time profile that a wafer is subjected to in accordance with the above process. Cluster processing has been developed in the prior art, which enables transferring of wafers from one processing chamber to another without an intervening exposure of the wafers to ambient air conditions. Such can eliminate air exposure of wafers, and thermocycling between seeding and nitride growth all the way to room temperature. Regardless, the prior art still achieves hemispherical grain layer smoothing resulting from the increase in temperature from the HSG annealing temperature to the subsequent dielectric layer deposition temperature.

Accordingly, needs remain for providing improved methods of producing roughened conductively doped polysilicon films for utilization in improved capacitor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a hemispherical grain polysilicon layer atop a substrate comprises the following steps:

providing a substantially amorphous layer of silicon over a substrate at a selected temperature;

raising the temperature of the substantially amorphous silicon layer to a higher dielectric layer deposition temperature, the temperature raising being effective to transform the amorphous silicon layer into hemispherical grain polysilicon; and depositing a dielectric layer over the silicon layer at the higher dielectric deposition temperature.

Figure 1:
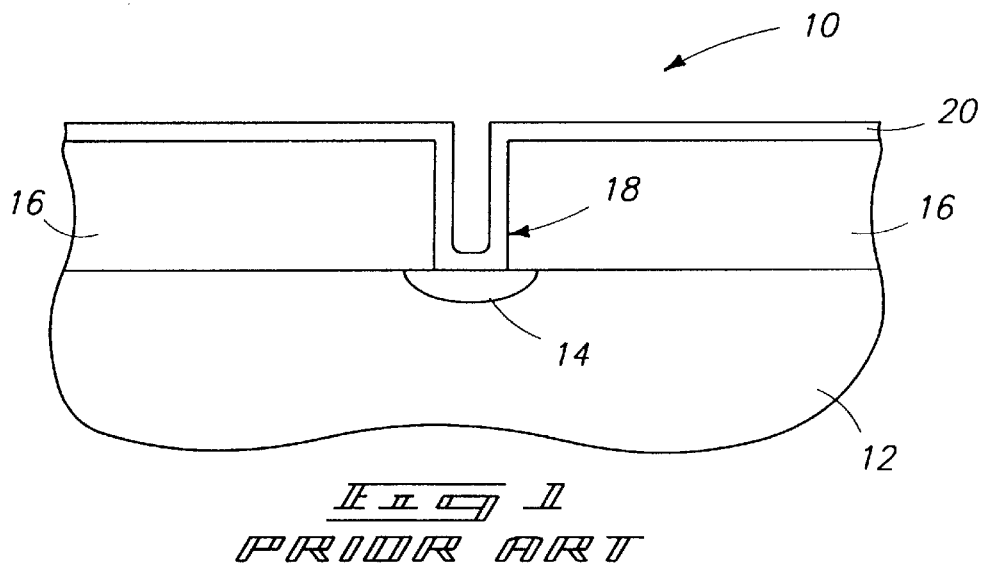
FIG. 1 is a diagrammatic sectional view of a semiconductor wafer fragment processed according to a prior art method and is discussed in the "Background" section above.
Figure 2:
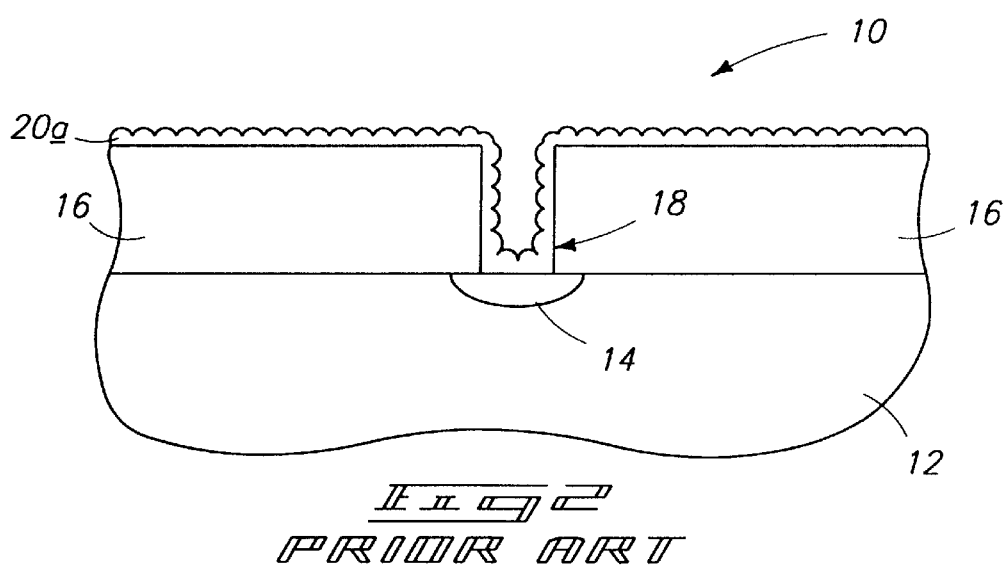
FIG. 2 is a view of the FIG. 1 wafer at a prior art processing step conducted, subsequently to that shown in FIG. 1.
Figure 3:
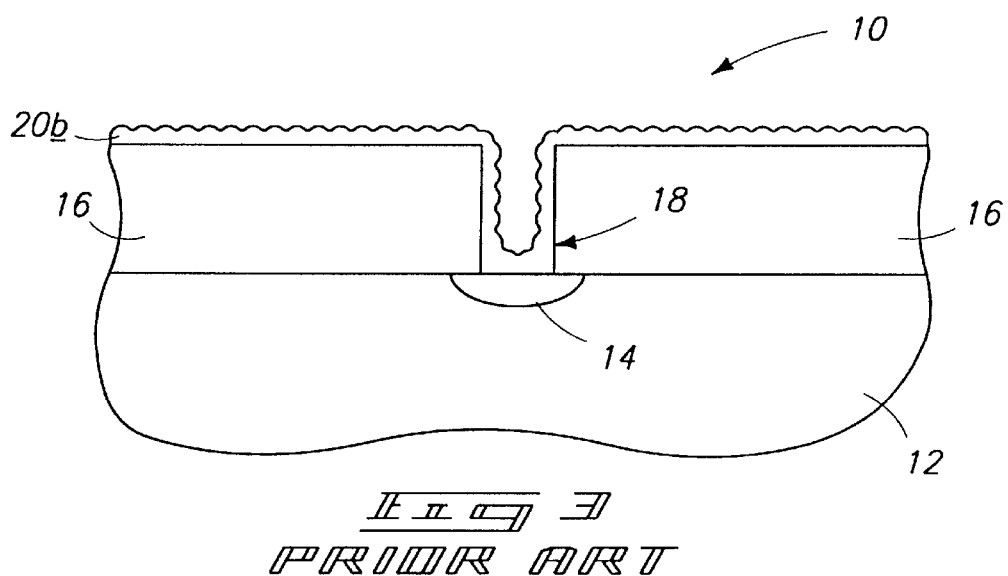
FIG. 3 is a view of the FIG. 1 wafer at a prior art processing step conducted subsequently to that shown in FIG. 2.
Figure 4:
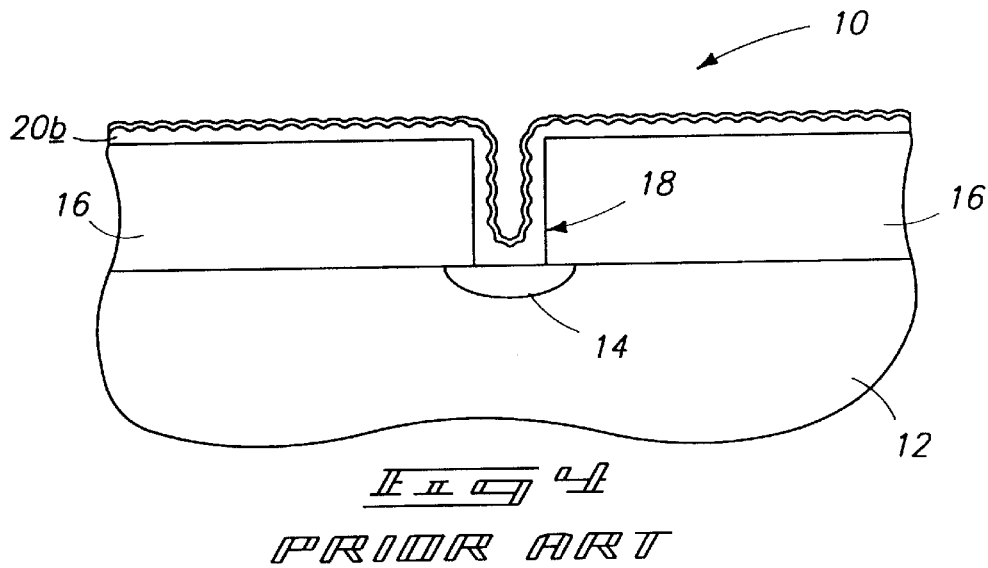
FIG. 4 is a view of the FIG. 1 wafer at a prior art processing step conducted subsequently to that shown in FIG. 3.
Figure 5:
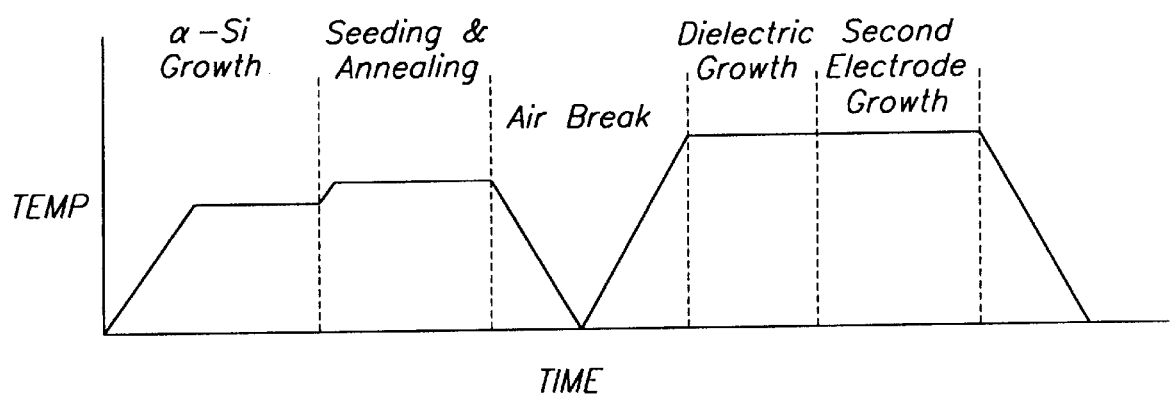
FIG. 5 is a graphical representation of temperature vs. time for the above FIGS. 1–4 prior art processing method.
Figure 6:
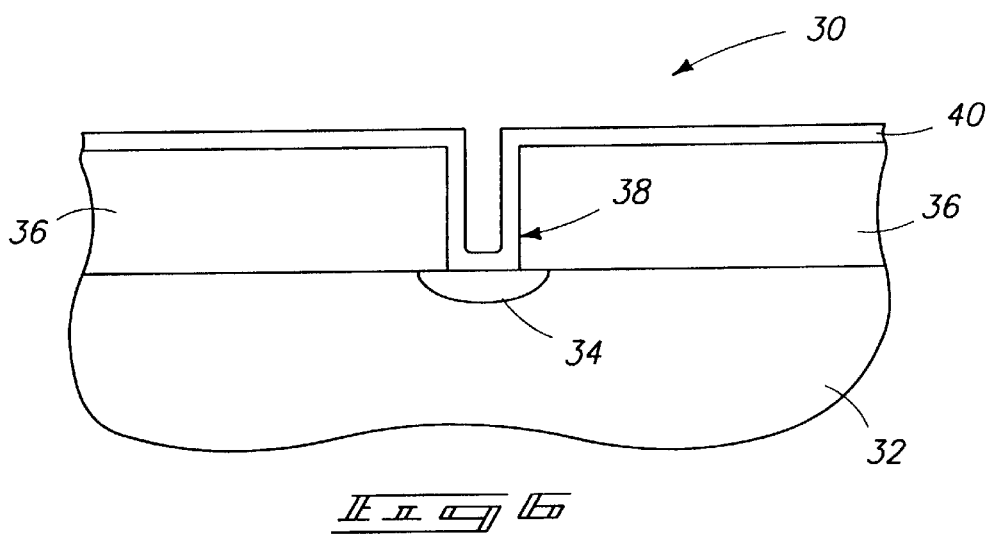
FIG. 6 is a diagrammatic sectional view of a semiconductor wafer fragment at one processing step in accordance with the invention.

Referring to FIG. 6, the semiconductor wafer fragment 30 is shown, comprising a bulk monocrystalline silicon substrate 32, a diffusion region 34, an insulating dielectric layer 36 having a contact opening 38 provided therethrough to diffusion region 34. A substantially amorphous layer of silicon 40 is provided over substrate 36/32 at a selected temperature, preferably at about 550° C. or less. An example and preferred thickness range for layer 40 as-deposited is from about 100 Angstroms to about 1000 Angstroms. Pressure during deposition is preferably from about 50 mTorr to about 250 mTorr, or higher. If desired, layer 40 can be cleaned at this point in the process, preferably by lowering the substrate temperature by 23° C. to 80° C. and includes an HF dip or spray. Most preferably, all processing in accordance with the invention occurs in a cluster tool apparatus such that no contamination occurs in between processing steps, thereby obviating any need for wafer cleaning.

Figure 7:
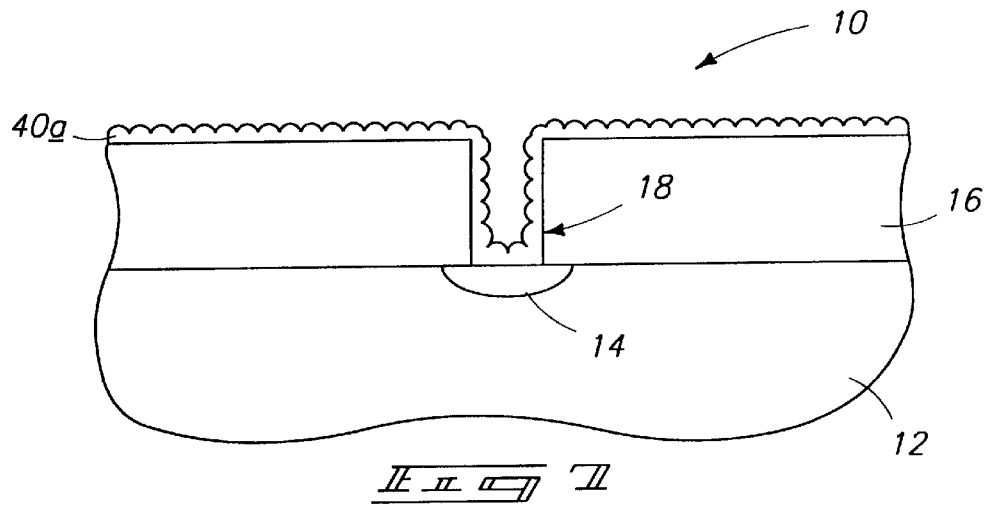
FIG. 7 is a view of the FIG. 6 wafer fragment at a processing step subsequent to that shown by FIG. 6.

Regardless of the cleaning, the temperature of the substantially amorphous silicon layer is subsequently raised to that temperature at which dielectric layer deposition will occur. Particle or other seeding can be provided outwardly of layer 40 prior to, during or after the temperature raising step to facilitate hemispherical grain growth. The temperature raising to the dielectric deposition temperature is effective to transform the amorphous silicon layer into a layer of hemispherical grain polysilicon, such as layer 40a in FIG. 7. A typical and preferred dielectric deposition temperature is from about 650° C. to about 850° C. The transformation from amorphous to hemispherical grain might substantially occur during the temperature rise to the higher dielectric layer deposition temperature, after the higher dielectric layer deposition temperature has been achieved but before dielectric layer deposition, or, even after the higher dielectric layer deposition temperature has been achieved and during dielectric layer deposition.

The chosen dielectric layer deposition temperature, and the timed interval taken to raise the wafer temperature from the selected temperature to the higher dielectric layer deposition temperature, are factors which will determine the degree to which transformation occurs during or after achieving the higher deposition temperature. For example, the lower the dielectric deposition temperature and the shorter the time interval of the temperature raising, the less likely substantial complete hemispherical grain transformation will occur prior to achieving the dielectric layer deposition temperature. On the other hand, the higher the dielectric layer deposition temperature and the slower the rate of increase to that temperature, the greater the likelihood that hemispherical grain transformation will occur at or just prior to achieving the higher dielectric layer deposition temperature. For example, a temperature ramp to an example nitridation temperature of 650° C. at from about 5° C./min. to about 10° C./min over 15 to 45 minutes at 100 mTorr will typically achieve HSG transformation during the ramp. On the other hand, rapid thermal processing to a desired nitridation temperature will typically result in HSG transformation after reaching the final nitridation temperature.

Figure 8:
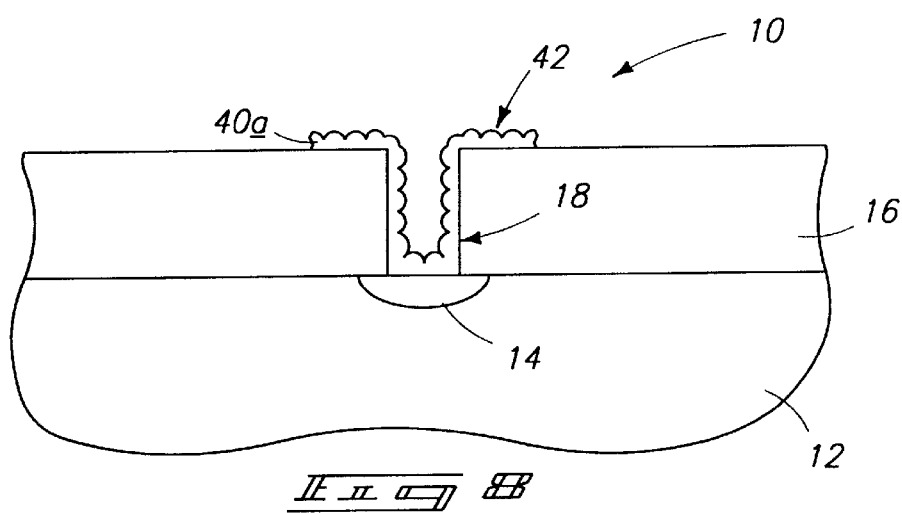
FIG. 8 is a view of the FIG. 6 wafer fragment at a processing step subsequent to that shown by FIG. 7.

FIG. 8 illustrates patterning and etching of hemispherical grain layer 40a into a desired lower capacitor plate shape 42. Alternately, the substantially amorphous silicon layer can be patterned into a desired shape prior to hemispherical grain formation.

Figure 9:
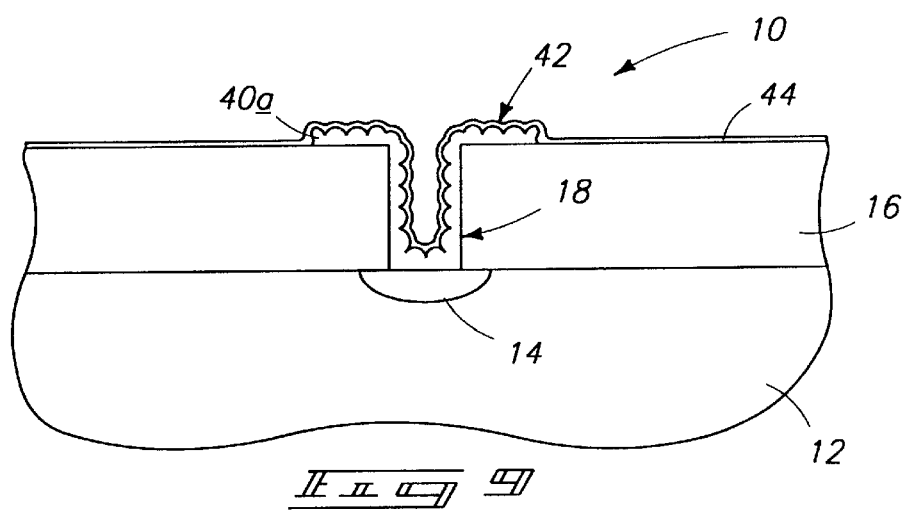
FIG. 9 is a view of the FIG. 6 wafer fragment at a processing step subsequent to that shown by FIG. 8.

Regardless and referring to FIG. 9, a dielectric layer 44 is deposited over the silicon layer at the higher dielectric deposition temperature. As alluded to above, the transformation to hemispherical grain material can be substantially completed prior to the step for depositing layer 44. Alternately, hemispherical grain layer transformation might occur during the provision of layer 44. Layer 44 preferably comprises $Si_3N_4$, or a composite of $SiO_2$—$Si_3N_4$—$SiO_2$.

Figure 10:
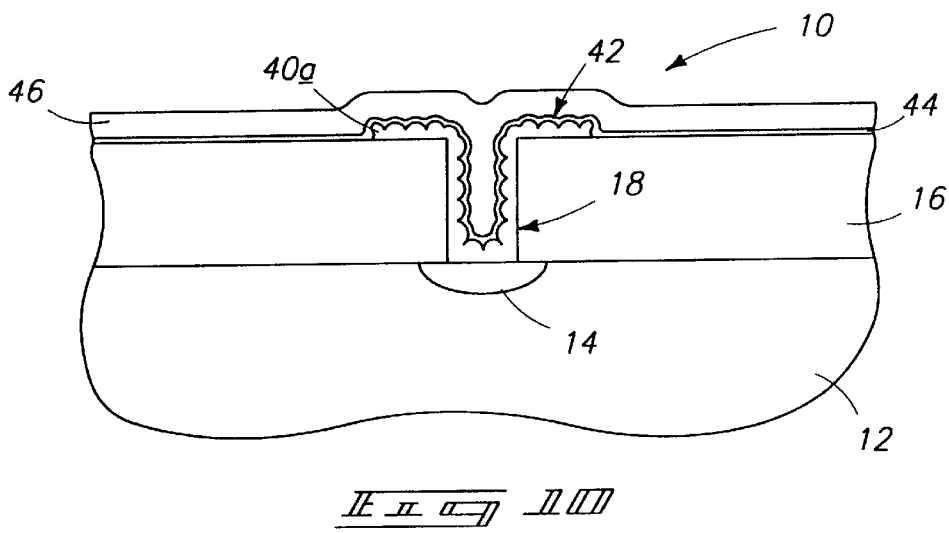
FIG. 10 is a view of the FIG. 6 wafer fragment at a processing step subsequent to that shown by FIG. 9.

Referring to FIG. 10, an outer capacitor plate layer 46 is provided outwardly of dielectric layer 44 to form a desired resultant capacitor construction. Processing in such manner effectively takes advantage of the nitride deposition temperature as an effective annealing step thereby effectively obviating the smoothing tendency problem of the prior art.

Figure 11:
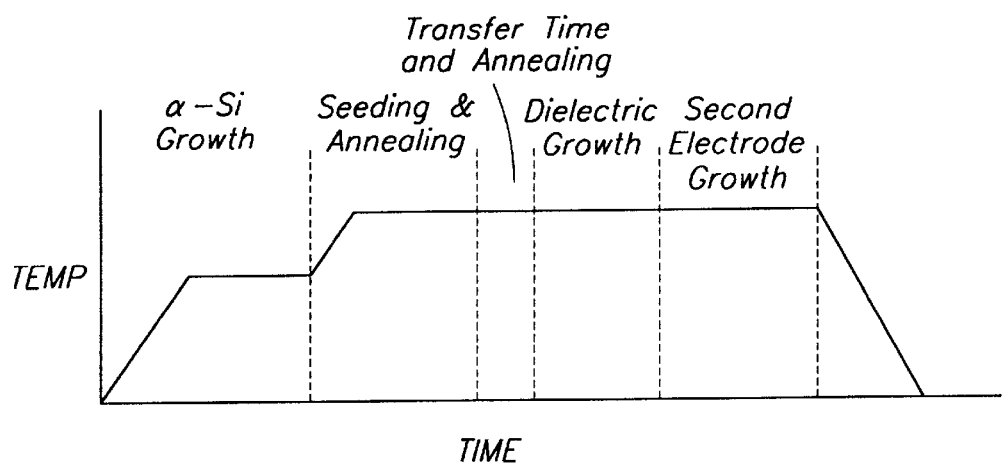
FIG. 11 is a graphical representation of temperature vs. time for one processing method in accordance with the invention.
Figure 12:
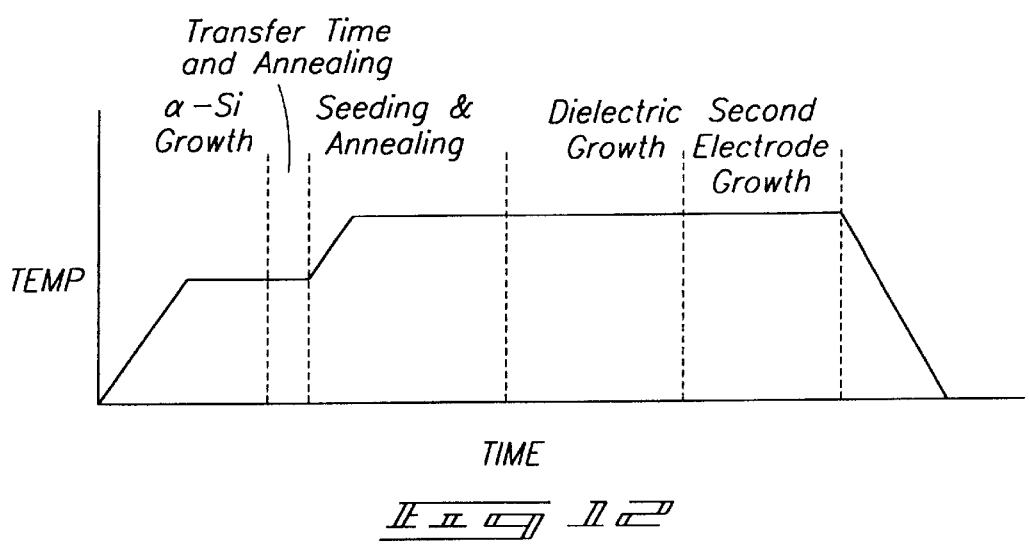
FIG. 12 is a graphical representation of temperature vs. time for another prosing method in accordance with the invention.

FIG. 11 illustrates an example profile of temperature vs. time of wafer processing in accordance with an aspect of the invention. In such process, the higher dielectric deposition temperature is achieved and maintained throughout the time of transfer from a seeding and annealing chamber to a nitride deposition chamber. FIG. 12 illustrates an alternate process whereby temperature increase and accordingly annealing occurs after transfer into a dielectric deposition chamber.

Further in accordance with an aspect of the invention, an intermediate annealing can be conducted if desired to increase the surface roughness of the initially deposited film. For example, the silicon layer temperature can be initially raised to an annealing temperature below the higher dielectric layer deposition temperature, and maintained there for a time period effective to increase the degree of surface roughness from its initial degree of surface roughness. Subsequently, the silicon layer temperature is raised to the higher dielectric layer deposition temperature, with the subsequent temperature raising further increasing the degree of surface roughness of the resultant silicon layer. One example intermediate surface roughening annealing would include maintaining an intermediate temperature of 555° C. at 300 mTorr in an $N_2$ ambient for 20 minutes. Further if desired, the annealed silicon layer could then be cleaned before subsequently raising the temperature to the higher dielectric layer deposition temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
    transforming an amorphous silicon layer into a hemispherical grain polysilicon layer at a first temperature; and
    without reducing a temperature of the transformed layer, depositing a dielectric layer over the silicon layer.

2. The semiconductor processing method of claim 1 wherein the first temperature is from about 650° C. to about 850° C.

3. The semiconductor processing method of claim 1 further comprising cleaning the amorphous silicon layer prior to raising the transformed layer temperature to a higher dielectric deposition temperature.

4. The semiconductor processing method of claim 1 wherein the depositing the dielectric layer comprises providing such layer to predominately comprise $Si_3N_4$.

5. The semiconductor processing method of claim 1 wherein the hemispherical grain layer is substantially formed before the depositing.

6. The semiconductor processing method of claim 1 wherein the hemispherical grain layer is substantially formed during the depositing.

7. The semiconductor processing method of claim 1 comprising providing the hemispherical grain polysilicon layer into a desired lower capacitor plate shape, and providing an outer capacitor plate outwardly of the dielectric layer to form a capacitor construction.

8. A semiconductor processing method of providing a hemispherical grain polysilicon layer atop a substrate comprising the following steps:
    providing an amorphous layer of silicon over a substrate at a selected temperature;
    raising the temperature of the amorphous silicon layer to a higher dielectric layer deposition temperature, the temperature raising being effective to transform the amorphous silicon layer into hemispherical grain polysilicon; and
    depositing a dielectric layer over the silicon layer at the higher dielectric deposition temperature, the dielectric layer comprising a composite of $SiO_2$ and $Si_3N_4$.

9. The semiconductor processing method of claim 1 wherein the first temperature occurs between about 650° C. to less than 700° C. or more than 750° C. to about 850° C.

10. The semiconductor processing method of claim 8 wherein the higher dielectric deposition temperature occurs between about 650° C. to less than 700° C. or more than 750° C. to about 850° C.

* * * * *

UNITED STATES PATENT AND TRADEMARK OFFICE
CERTIFICATE OF CORRECTION

PATENT NO. : 6,194,264 B1
DATED : February 27, 2001
INVENTOR(S) : Er-Xuan Ping, et al.

Page 1 of 1

It is certified that error appears in the above-identified patent and that said Letters Patent is hereby corrected as shown below:

Inventors: replace "Er-Xang" with -- Er-Xuan --.

Column 3,
Line 32, replace "prosing" with -- processing --.

Signed and Sealed this

Twenty-eighth Day of August, 2001

Attest:

NICHOLAS P. GODICI
Attesting Officer
Acting Director of the United States Patent and Trademark Office